(12) United States Patent
Bilenko et al.

(10) Patent No.: US 9,704,774 B2
(45) Date of Patent: Jul. 11, 2017

(54) THERMAL MANAGEMENT STRUCTURE WITH INTEGRATED HEAT SINK

(71) Applicant: Sensor Electronic Technology, Inc., Columbia, SC (US)

(72) Inventors: Yuri Bilenko, Columbia, SC (US); Michael Shur, Latham, NY (US); Remigijus Gaska, Columbia, SC (US)

(73) Assignee: SENSOR ELECTRONIC TECHNOLOGY, INC., Columbia, SC (US)

( * ) Notice: Subject to any disclaimer, the term of this patent is extended or adjusted under 35 U.S.C. 154(b) by 131 days.

(21) Appl. No.: 14/102,538

(22) Filed: Dec. 11, 2013

(65) Prior Publication Data
US 2014/0159240 A1 Jun. 12, 2014

Related U.S. Application Data

(60) Provisional application No. 61/735,648, filed on Dec. 11, 2012.

(51) Int. Cl.
*H01L 23/34* (2006.01)
*H01L 21/288* (2006.01)
*H01L 23/498* (2006.01)
*H01L 23/367* (2006.01)
*H01L 33/20* (2010.01)
*H01L 33/38* (2010.01)
*H01L 33/64* (2010.01)

(52) U.S. Cl.
CPC ............ *H01L 23/367* (2013.01); *H01L 33/20* (2013.01); *H01L 33/38* (2013.01); *H01L 33/642* (2013.01); *H01L 2224/16* (2013.01)

(58) Field of Classification Search
CPC ...... H01L 23/34; H01L 21/288; H01L 23/498
See application file for complete search history.

(56) References Cited

U.S. PATENT DOCUMENTS 5,857,767 A 1/1999 Hochstein
6,428,189 B1 8/2002 Hochstein
(Continued)

FOREIGN PATENT DOCUMENTS

CN 202363516 U 8/2012
KR 10-0587018 6/2006
(Continued)

OTHER PUBLICATIONS

Park, Search Report and Written Opinion for PCT Application Serial No. PCT/US2013/074226, Apr. 3, 2014, 9 pages.
(Continued)

*Primary Examiner* — Olik Chaudhuri
*Assistant Examiner* — Lamont Koo
(74) *Attorney, Agent, or Firm* — Labatt, LLC

(57) ABSTRACT

A thermal management structure for a device is provided. The thermal management structure includes electroplated metal, which connects multiple contact regions for a first contact of a first type located on a first side of the device. The electroplated metal can form a bridge structure over a contact region for a second contact of a second type without contacting the second contact. The thermal management structure also can include a layer of insulating material located on the contact region of the second type, below the bridge structure.

20 Claims, 7 Drawing Sheets

(56) References Cited

U.S. PATENT DOCUMENTS

| | | | |
|---|---|---|---|
| 6,561,680 B1 | 5/2003 | Shih | |
| 6,590,773 B1 | 7/2003 | Lin | |
| 6,614,109 B2* | 9/2003 | Cordes et al. | 257/712 |
| 6,857,767 B2 | 2/2005 | Matsui et al. | |
| 6,999,318 B2 | 2/2006 | Newby | |
| 7,095,053 B2 | 8/2006 | Mazzochette et al. | |
| 7,098,483 B2 | 8/2006 | Mazzochette et al. | |
| 7,176,502 B2 | 2/2007 | Mazzochette et al. | |
| 7,196,459 B2 | 3/2007 | Morris | |
| 7,236,366 B2 | 6/2007 | Chen | |
| 7,806,574 B2 | 10/2010 | Van Laanen et al. | |
| 7,898,811 B2 | 3/2011 | Storey | |
| 8,011,799 B2 | 9/2011 | Van Laanen et al. | |
| 2001/0013224 A1* | 8/2001 | Ohkubo et al. | 62/3.7 |
| 2004/0118129 A1* | 6/2004 | Chrysler et al. | 62/3.2 |
| 2006/0243317 A1* | 11/2006 | Venkatasubramanian | 136/206 |
| 2007/0194465 A1* | 8/2007 | Dai et al. | 257/794 |
| 2007/0220902 A1* | 9/2007 | Matsuoka | H01L 35/32 62/3.3 |
| 2011/0073838 A1 | 3/2011 | Khan et al. | |
| 2011/0210345 A1 | 9/2011 | Lim et al. | |

FOREIGN PATENT DOCUMENTS

| | | |
|---|---|---|
| KR | 10-1014102 | 2/2011 |
| KR | 10-2011-0069374 | 6/2011 |
| WO | 2010-140091 | 12/2010 |

OTHER PUBLICATIONS

Guo, X., Chinese Application No. 201380064482.0, Office Action 1 (with English translation), Nov. 21, 2016, 17 pages.

* cited by examiner

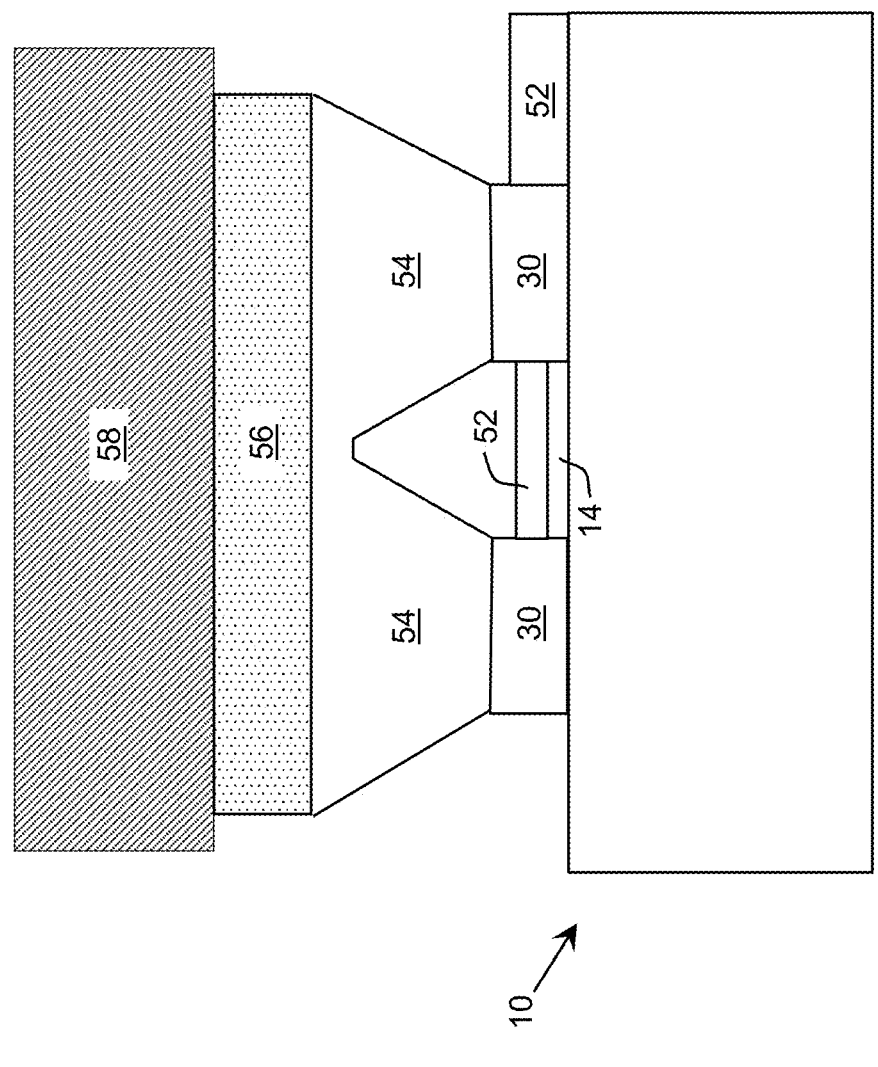

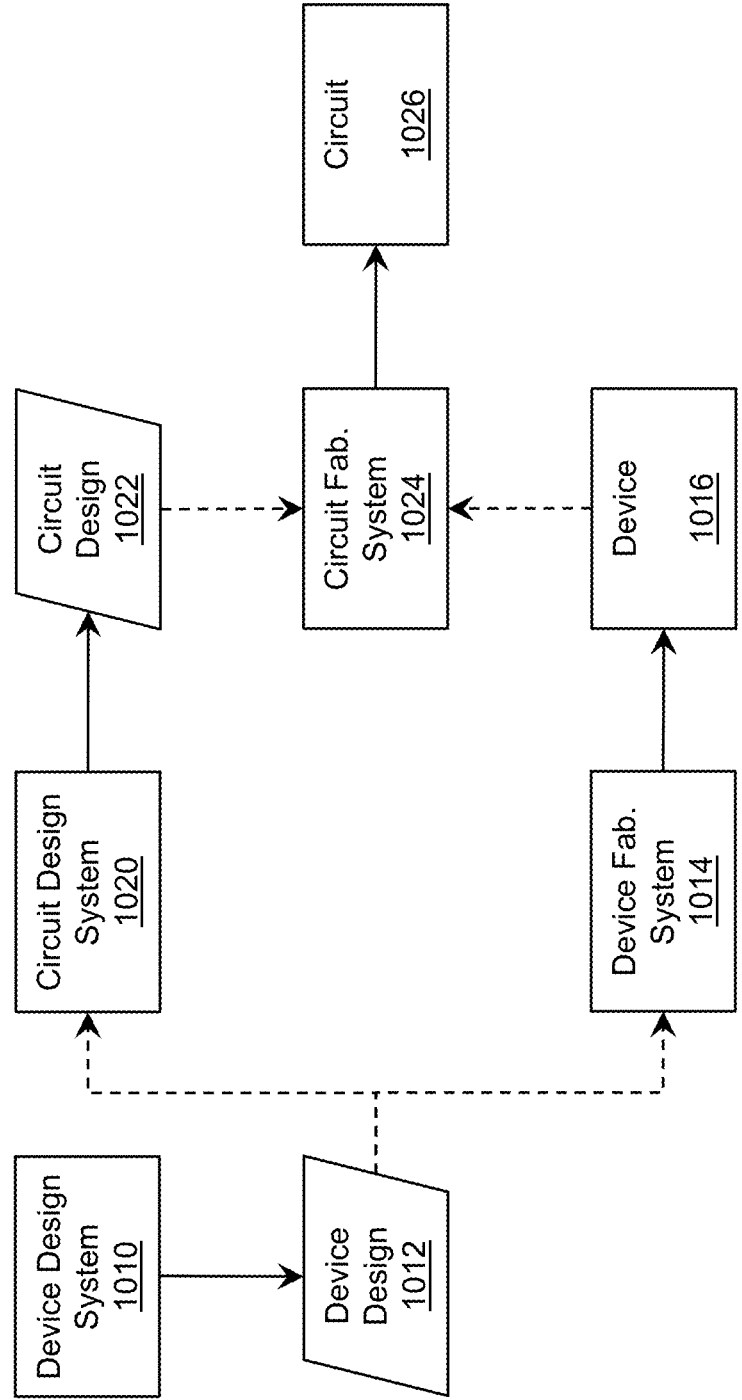

THERMAL MANAGEMENT STRUCTURE WITH INTEGRATED HEAT SINK

REFERENCE TO RELATED APPLICATIONS

The current application claims the benefit of U.S. Provisional Application No. 61/735,648, titled "Thermal Management Device Light Emitting Element with Integrated Electroplated Heat Sink and Method of Making the Same," which was filed on 11 Dec. 2012, and which is hereby incorporated by reference.

TECHNICAL FIELD

The disclosure relates generally to thermal management of electronic and photonic devices, and more particularly, to solution for efficiently transporting heat away from these devices through the contacts of the devices.

BACKGROUND ART

Various thermal management approaches have been proposed to improve heat transfer from optoelectronic and electronic devices to external heat dissipaters. Dissipation of heat from an optoelectronic device, such as a light emitting diode, is particularly important as the power output may decrease with a rise in operating temperature and permanent degradation (aging) of a light emitting device is an exponential function of the operating temperature. Conventional light emitting devices employ two electrical leads, which also serve as the heat conduction path to a heat dissipater. However, conventional optoelectronic devices exhibit substantial thermal resistance because of poor thermal coupling with the heat dissipater.

One approach obtains some improvement in the thermal performance by making the leads of highly conductive metals, such as copper. However, attaining full advantage of the highly conductive leads is prevented due to mounting problems. In particular, since most leads of most optoelectronic devices are soldered to traces on the circuit board, the heat from the soldering process can easily damage the optoelectronic device when the leads are highly thermally conductive. A previous approach seeks to address the problem by adhesively attaching the leads of a light emitting device to the traces on the circuit board. Various other approaches have been proposed to address the mounting of light emitting diodes and other optoelectronic devices for the purpose of heat dissipation.

SUMMARY OF THE INVENTION

The inventors recognize that various previous approaches have not sought to improve thermal management within an electronic device with multiple contacts, and particularly an optoelectronic device, such as a light emitting diode. Aspects of the invention provide a thermal management structure for a device. The thermal management structure includes electroplated metal, which connects multiple contact regions for a first contact of a first type located on a first side of the device. The electroplated metal can form a bridge structure over a contact region for a second contact of a second type without contacting the second contact. The thermal management structure also can include a layer of insulating material located on the contact region of the second type, below the bridge structure.

A first aspect of the invention provides a device including: a first contact of a first type located on a first side of the device, the first contact including a first contact region and a second contact region; a second contact of a second type, distinct from the first type, wherein the second contact includes a third contact region located on the first side of the device between the first contact region and the second contact region; and a thermal management structure, the thermal management structure including electroplated metal contacting a top surface of the first contact region and a top surface of the second contact region and forming a bridge structure over the third contact region without contacting the second contact.

A second aspect of the invention provides a method comprising: applying a dielectric mask to a first contact of a first type located on a first side of a semiconductor structure; and electroplating a plurality of distinct regions of a second contact of a second type, distinct from the first type, located on the first side of the semiconductor device, wherein the electroplating results in merger of the plurality of distinct regions into a monolithic metallic layer.

A third aspect of the invention provides a device comprising: a first contact region of a first type located on a first side of the device; a second contact region of the first type located on the first side of the device; a third contact region of a second type, distinct from the first type, located on the first side of the device between the first contact region and the second contact region; and a thermal management structure, the thermal management structure including: a layer of insulating material located on the third contact region; and electroplated metal contacting a top surface of the first contact region and the second contact region and forming a bridge structure over the layer of insulating material.

The illustrative aspects of the invention are designed to solve one or more of the problems herein described and/or one or more other problems not discussed.

BRIEF DESCRIPTION OF THE DRAWINGS

These and other features of the disclosure will be more readily understood from the following detailed description of the various aspects of the invention taken in conjunction with the accompanying drawings that depict various aspects of the invention.

FIG. 6 shows a cross sectional view of a schematic structure of an illustrative thermal management structure for a device according to an embodiment.

FIG. 7 shows an illustrative flow diagram for fabricating a circuit according to an embodiment.

It is noted that the drawings may not be to scale. The drawings are intended to depict only typical aspects of the invention, and therefore should not be considered as limiting the scope of the invention. In the drawings, like numbering represents like elements between the drawings.

DETAILED DESCRIPTION OF THE INVENTION

As indicated above, aspects of the invention provide a thermal management structure for a device. The thermal management structure includes electroplated metal, which connects multiple contact regions for a first contact of a first type located on a first side of the device. The electroplated metal can form a bridge structure over a contact region for a second contact of a second type without contacting the second contact. The thermal management structure also can include a layer of insulating material located on the contact region of the second type, below the bridge structure. As used herein, unless otherwise noted, the term "set" means one or more (i.e., at least one) and the phrase "any solution" means any now known or later developed solution.

Aspects of the invention can be applied to the manufacture of a thermal management structure, which can be utilized in conjunction with various types of semiconductor devices. Embodiments can be directed to semiconductor devices including at least two contacts of different types located on the same side (e.g., top) of the device structure. In a more particular illustrative embodiment, the semiconductor device comprises a photonic device, such as a light emitting diode (LED) or other type of photoelectric device, having an anode and cathode located on the same side of the device. However, embodiments can be utilized in conjunction with various types of semiconductor devices including, for example, various optoelectronic devices such as light emitting diodes that are flip chip mounted, light emitting diodes having complex contact structures and/or multiple contacts, semiconductor lasers, various types of electronic devices, such as various types of semiconductor diodes, semiconductor transistors, and/or the like.

Figure 1:
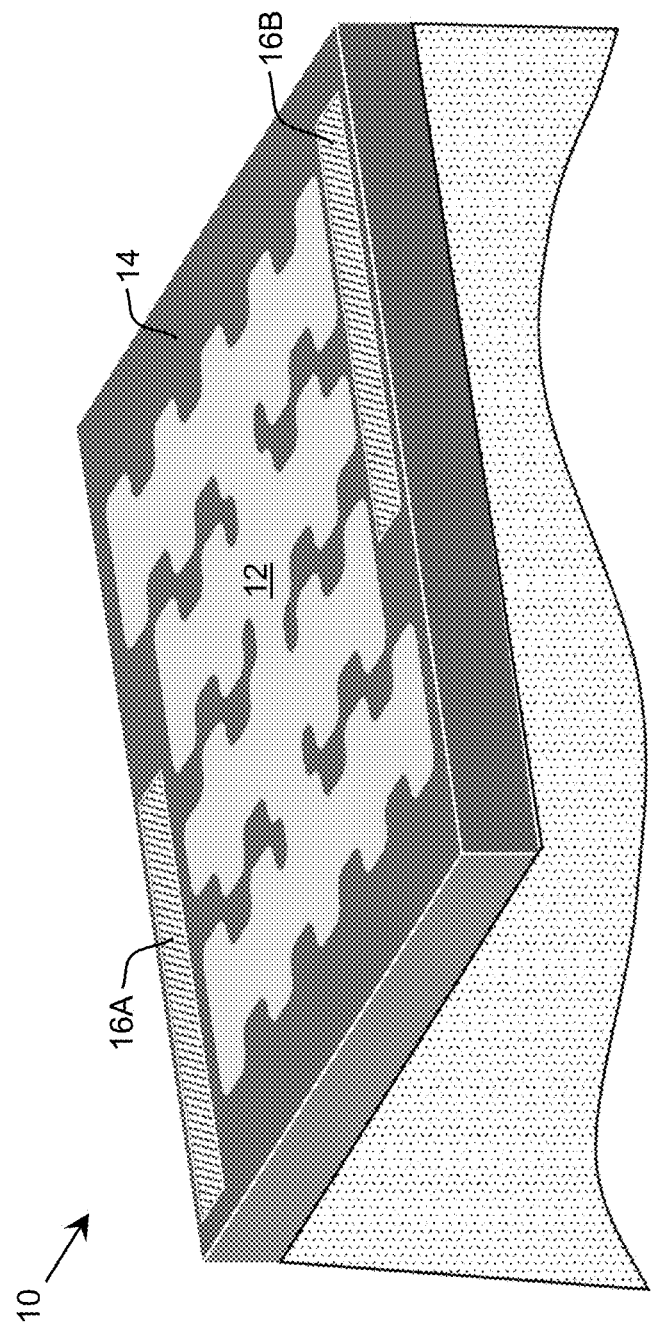
FIG. 1 shows an isometric view of a schematic structure of an illustrative device according to the prior art.
Figure 2:
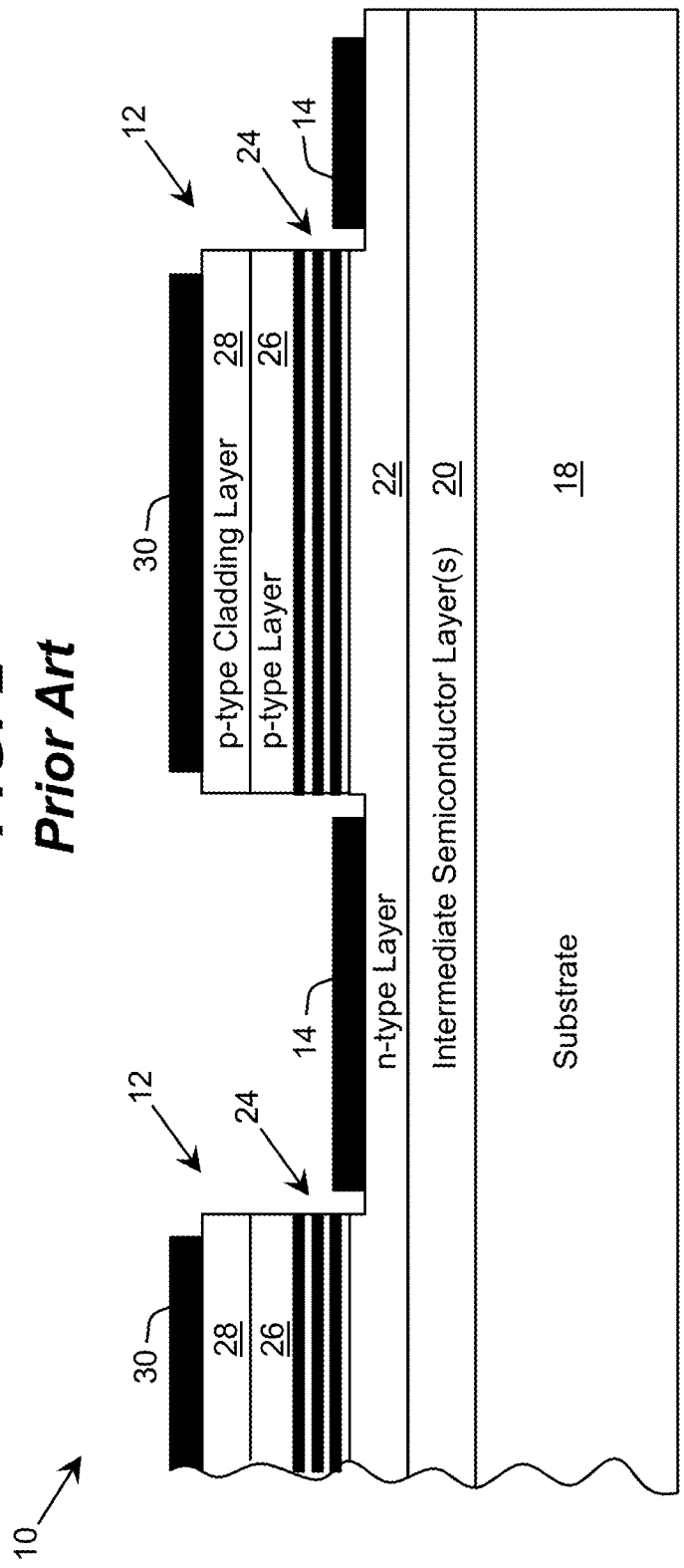
FIG. 2 shows a cross sectional view of a schematic structure of an illustrative device according to the prior art.

Additional aspects of the invention are described in conjunction with an illustrative light emitting diode having a complex mesa structure. Turning to the drawings, FIG. 1 shows an isometric view and FIG. 2 shows a cross sectional view of a schematic structure of an illustrative device 10 according to the prior art. The device 10 can be configured to operate as a light emitting diode. In this case, the device 10 includes a complex mesa structure 12 and a complex cathode (n-type contact) 14. The complex mesa structure 12 can be designed to decrease current crowding during operation of the device 10. An anode (not shown) can be attached to at least some portions of the mesa structure 12, and the cathode 14 can be connected to an n-type contact by a set of leads 16A, 16B (shown in FIG. 1 only).

As shown more clearly in FIG. 2, the heterostructure for the emitting device 10 can include a substrate 18, a set of intermediate semiconductor layers 20 (e.g., a buffer layer), an n-type layer 22 (e.g., an electron supply layer), an active region 24 (e.g., a set of quantum wells and barriers), a p-type layer 26 (e.g., an electron blocking layer), and a p-type cladding layer 28 (e.g., a hole supply layer), which can be fabricated using any solution. For example, fabrication of the heterostructure can include epitaxially growing each of the layers 20, 22, 24, 26, 28 on the substrate 18. Subsequently, formation of the mesa structure 12 and access to the n-type layer 22 can be obtained by applying a mask (e.g., a photo-lithographical mask) defining the mesa structure 12 and etching the layers 24, 26, 28 and a portion of the n-type layer 22 to form the mesa structure 12. The n-type contact 14 can be applied (e.g., deposited) onto the exposed portions of the n-type layer 22 and a p-type contact 30 can be applied (e.g., deposited) to the p-type cladding layer 28 of the mesa structure 12 to provide an anode contact for the device 10. In this case, the n-type contact 14 and the p-type contact 30 have complex geometrical shapes.

In a more particular illustrative embodiment, the emitting device 10 is a group III-V materials based device, in which some or all of the various layers are formed of elements selected from the group III-V materials system. In a still more particular illustrative embodiment, the various layers of the emitting device 10 are formed of group III nitride based materials. Group III nitride materials comprise one or more group III elements (e.g., boron (B), aluminum (Al), gallium (Ga), and indium (In)) and nitrogen (N), such that $B_W Al_X Ga_Y In_Z N$, where $0 \leq W, X, Y, Z \leq 1$, and $W+X+Y+Z=1$. Illustrative group III nitride materials include AlN, GaN, InN, BN, AlGaN, AlInN, AlBN, AlGaInN, AlGaBN, AlInBN, and AlGaInBN with any molar fraction of group III elements.

An illustrative embodiment of a group III nitride based emitting device 10 includes an active region 24 (e.g., a series of alternating quantum wells and barriers) composed of $In_y Al_x Ga_{1-x-y} N$, $Ga_z In_y Al_x B_{1-x-y-z} N$, an $Al_x Ga_{1-x} N$ semiconductor alloy, or the like. Similarly, both the n-type layer 22 and the p-type layer 26 and p-type cladding layer 28 can be composed of an $In_y Al_x Ga_{1-x-y} N$ alloy, a $Ga_z In_y Al_x B_{1-x-y-z} N$ alloy, or the like. The molar fractions given by x, y, and z can vary between the various layers 22, 24, 26, and 28. The substrate 18 can be sapphire, silicon carbide (SiC), silicon (Si), germanium, a bulk semiconductor template material, such as AlN, GaN, BN, AlGaN, AlInN, AlON, $LiGaO_2$, AlGaBN, AlGaInN, AlGaInBN, and/or the like, or another suitable material, and can be polar, non-polar, or semi-polar. The set of intermediate semiconductor layers 20 can be composed of AlN, AlGaN, AlInN, AlGaBN, AlGaInN, AlGaInBN, an AlGaN/AlN superlattice, and/or the like.

Figure 3:
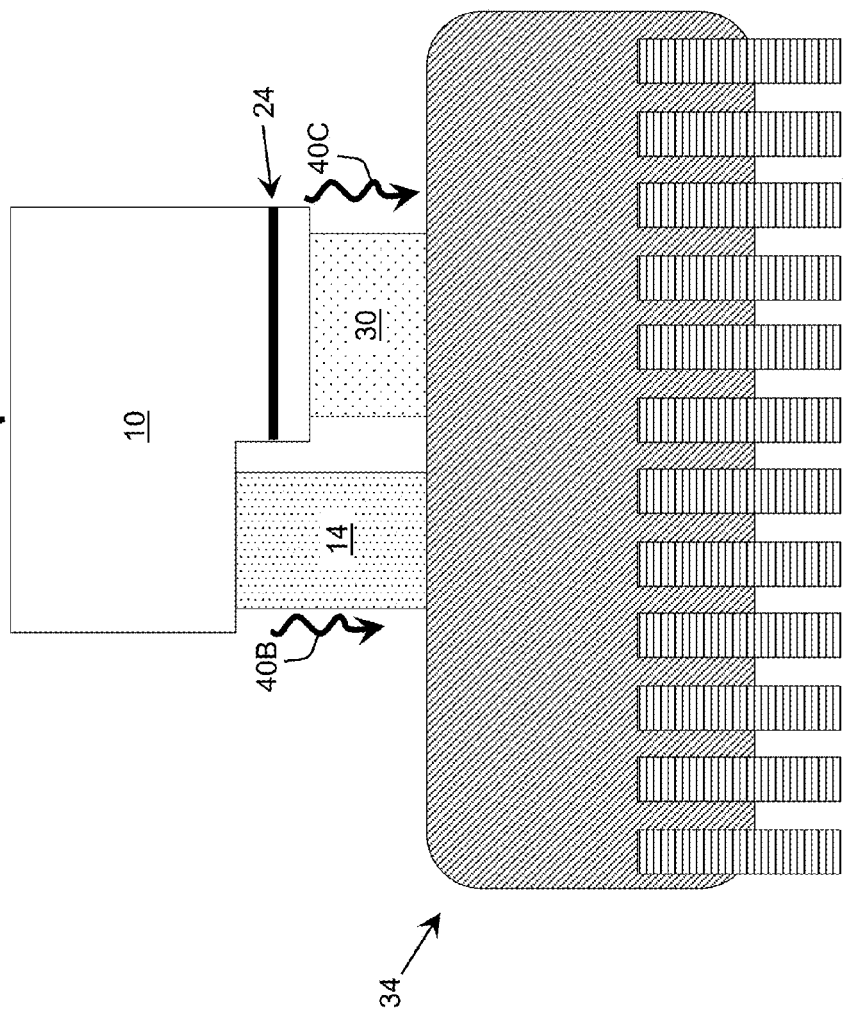
FIG. 3 shows a schematic illustration of an emitting device implemented in a flip chip design configuration according to the prior art.

FIG. 3 shows a schematic illustration of an emitting device 10 implemented in a flip chip design configuration according to the prior art. In this case, three main heat pathways 40A-40C are present during operation of the device 10. Both an n-type contact 14 and a p-type contact 30 provide pathways 40B, 40C, respectively, through which the device 10 conducts heat to a heat dissipating element 34 (e.g., a heat sink). In general, heat dissipation via pathway 40A is very small as it is due to heat transfer through convection. In particular, a thermal resistance associated with the pathway 40A is very high, e.g., as high as $10^5$ Kelvins/Watt (K/W), for an optoelectronic device 10 with a small area, thereby resulting in a small dissipation of heat along the pathway 40A.

Heat dissipation via pathway 40B (e.g., through the cathode of the device 10) also is typically small. In particular, a thickness of the n-type layer 22 (FIG. 2) and the n-type contact leads 16A, 16B (FIG. 2) are relatively small. For example, the n-type layer 22 may have a thickness of a few microns (e.g., 3.5 microns), while the n-type contact leads 16A, 16B may have a thickness of approximately 0.5 microns. Assuming a perimeter of the mesa structure 12 (FIG. 2) on the order of approximately one hundred microns, a cross sectional area for heat propagation through the n-type layer 22 and n-type contact leads 16A, 16B is on the order of four hundred microns squared. A length, L, that the heat has to travel before reaching the n-type contact leads 16A, 16B is on the order of tens of microns for a large device, and can be as much as a few hundreds of microns. For a typical group III nitride device, a conductive coefficient of an AlGaN based n-type layer is typically about 50 Watts per meter Kelvin (W/m·K) and the conductive coefficient of an n-type contact can be as high as 400 W/m·K. Using thicknesses of 3.5 microns and 0.5 microns, respectively, an average conductive coefficient can be estimated to be: (50*3.5+400*0.5)/4~100 W/m·K. Assuming: a length, L, of approximately 50 microns; an average thermal conductivity, k, of the n-type layer 22 and n-type contact leads 16A, 16B of 100 W/m·K; and a total cross-sectional area perpendicular to the path of heat flow for the n-type contact leads 16A, 16B, A, of approximately 400 microns squared; the thermal resistance for the n-type pathway 40B, $R_{Th,n}$, can be estimated as:

$$R_{Th,n}=L/(A \cdot k)=50 \cdot 10^6/(400 \cdot 100) \text{ [K/W]} \sim 1000 \text{ [K/W]}.$$

A thermal resistance for the p-type pathway 40C, $R_{Th,p}$, can be approximated by computing a thermal resistance of a p-type mesa structure 12 having: a cross-sectional area perpendicular to the path of heat flow, A, of approximately 0.5 millimeters squared; a length of a path, L, of at most one micron; and a thermal conductivity, k, of approximately 50 W/m·K. This results in an estimation of:

$$R_{Th,p}=L/(A \cdot k)=10^{-6}/(0.5 \cdot 10^{-6}) \cdot 50)=0.04 \text{ K/W}.$$

As illustrated, the thermal resistance of the n-type pathway 40B is substantially larger than the thermal resistance of the p-type pathway 40C, which is orders of magnitude smaller. Regardless, it is understood that the thermal resistances are only approximations for an illustrative device configuration. In practice, an actual thermal resistance may differ. For example, the thermal resistance of the p-type pathway 40C may be larger due to a presence of interfaces and/or adhesive layers for mounting the device 10 inside a device package, which may add to a total thermal resistance of the device 10. More particularly, the p-type and n-type contacts may be soldered to a submount, which in turn can be attached to the device package by the use of a thermally conductive epoxy.

An embodiment is directed to a thermal management structure that increases heat extraction from a device, such as the optoelectronic device 10. A more particular embodiment can be directed to improving the heat extraction via a pathway having a low thermal resistance (e.g., through one type of contact), while shielding at least a portion of another pathway having a higher thermal resistance (e.g., another type of contact on the same side of the device). The heat extraction can be improved by providing a larger cross section area for a set of metallic contact regions of a first type. Each contact region is defined as one of a plurality of isolated regions for the contact, one of a plurality of portions of irregular edges of a contact area of the contact, and/or the like. To this extent, when considering an entirety of a contact, two contact regions may be laterally connected. However, when considering a vertical cross section of the contact, the two regions are disconnected. The larger cross section area can be attained by, for example, heavy metallizing the set of contact regions, which can merge the irregular or disjoint contact regions and form a bridge structure over one or more regions of a second contact of a second type. The contact of the second type can be protected by a passivating insulator or the like located between the second contact and the bridge structure.

Figure 4:
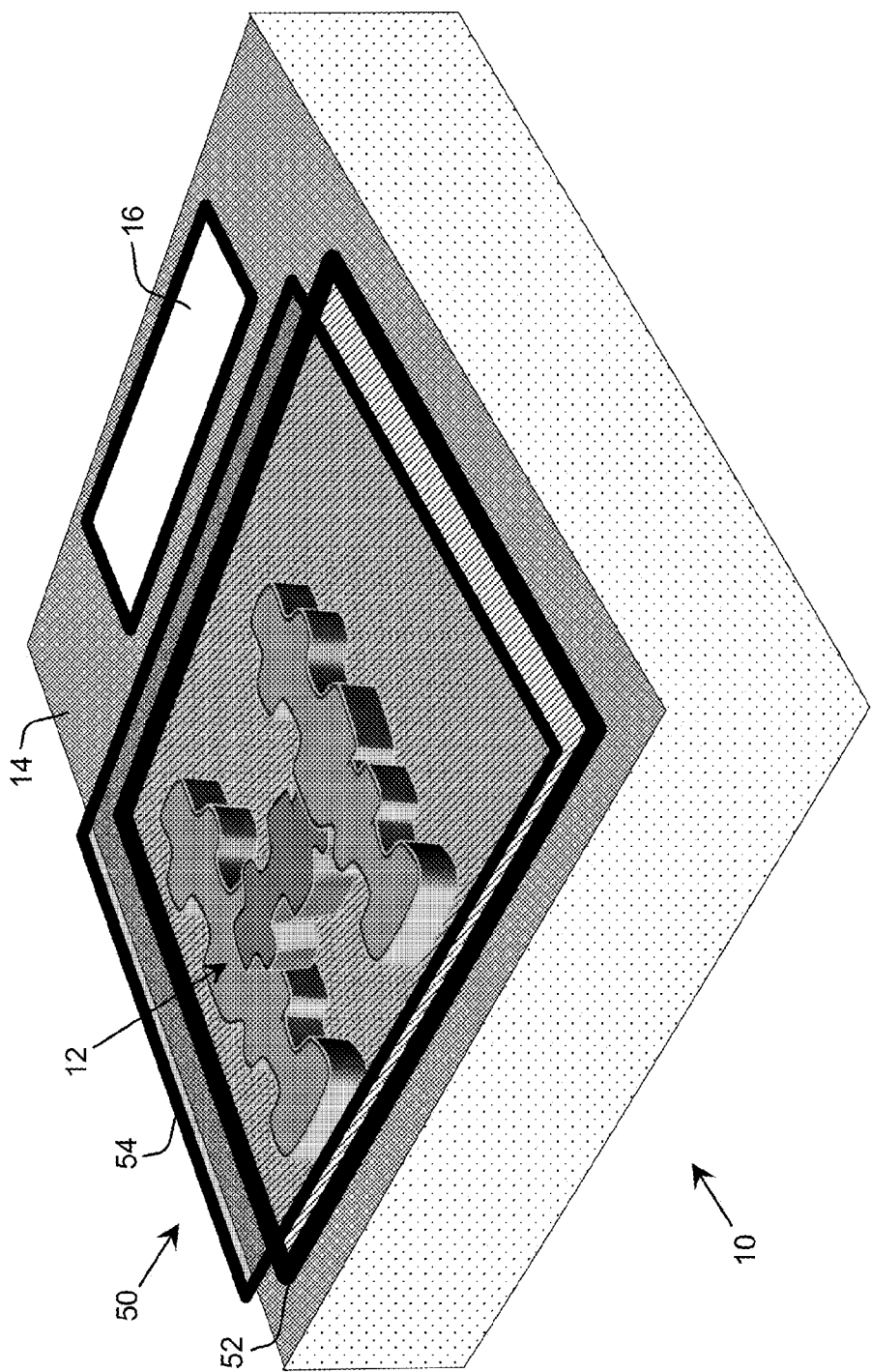
FIG. 4 shows an isometric view of a schematic structure of an illustrative thermal management structure for a device according to an embodiment.
Figure 5:
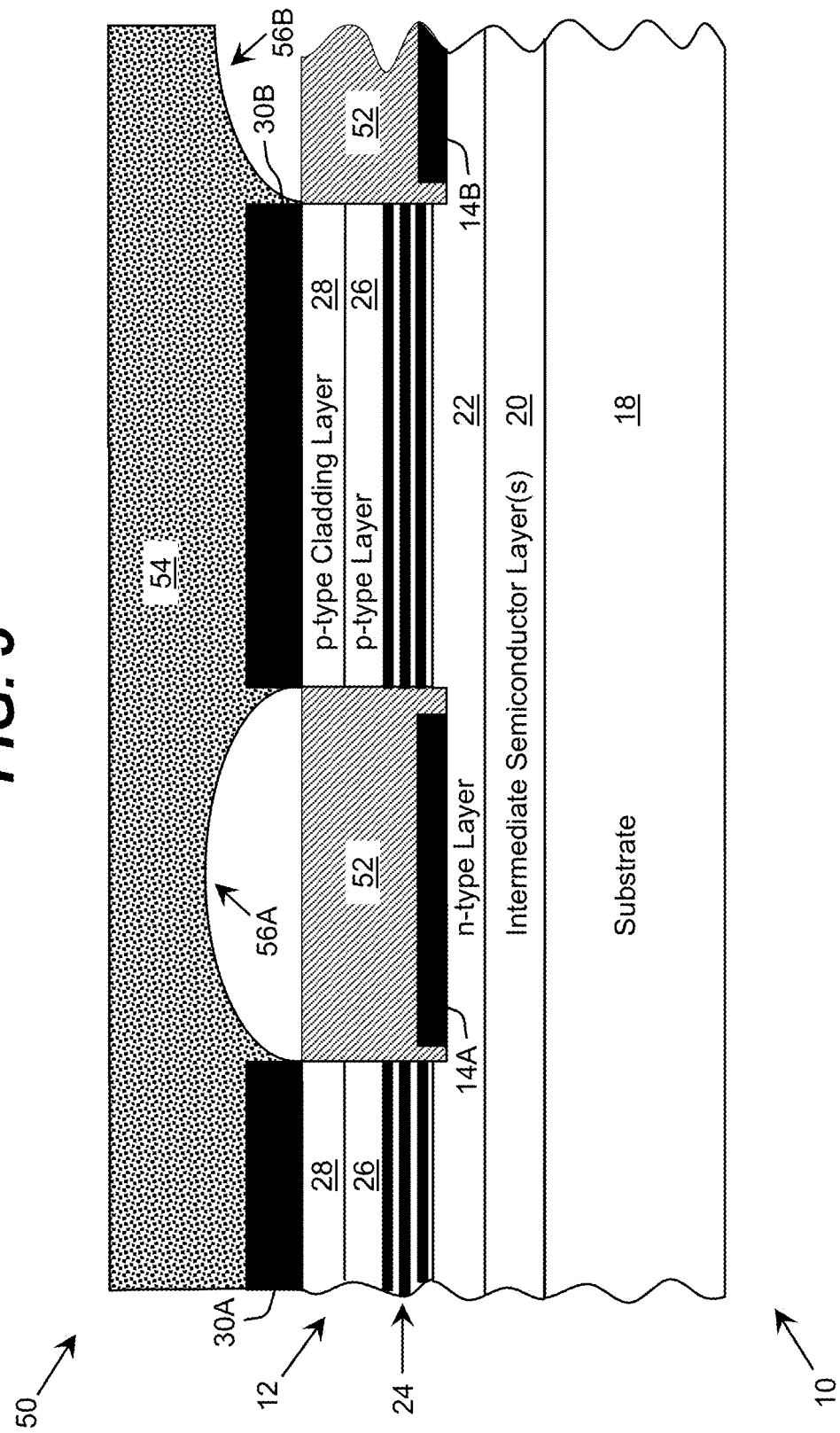
FIG. 5 shows a cross sectional view of a schematic structure of an illustrative thermal management structure for a device according to an embodiment.

To this extent, FIG. 4 shows an isometric view and FIG. 5 shows a cross sectional view of a schematic structure of an illustrative thermal management structure 50 for a device, such as the device 10, according to an embodiment. The device 10 includes an n-type contact 14, portions of which are located within the irregular boundary of the mesa structure 12 and corresponding p-type contact located thereon. To this extent, as shown in the cross sectional view of FIG. 5, the n-type contact 14 includes contact regions 14A, 14B, which are at least partially isolated from one another by the mesa structure 12. Similarly, the p-type contact includes contact regions 30A, 30B that are at least partially isolated from one another by gaps in the cross sectional border of the mesa structure 12 and include one or more contact regions, such as contact region 14A, located there between.

The thermal management structure 50 can include a dielectric layer 52 located on a set of contact regions 14A, 14B of a contact of a first type (e.g., the n-type contact 14) and electroplated metal 54 located on a set of contact regions 30A, 30B of a contact of a second type (e.g., a p-type contact). The electroplated metal 54 forms a set of bridge structures 56A, 56B over the set of contact regions 14A, 14B of the first type. The contact 14 is connected to a lead 16 located outside a region of the thermal management structure 50. The lead 16 can be formed of metal and can be included as an additional pathway for dissipating heat from the device 10.

It is understood that the configuration shown in FIGS. 4 and 5 is only illustrative. For example, in another embodiment, the thermal management structure can include a dielectric layer shielding a set of p-type contact regions while electroplated metal is formed on a set of n-type contact regions forming bridge structure(s) over the set of p-type contact regions. The dielectric layer 52 can be formed of any type of insulating material, such as silicon dioxide. However, it is understood that this also is only illustrative. In other embodiments, a set of contact regions can be protected by air, a fluid, an inert gas, and/or the like. In an embodiment, the electroplated metal 54 and lead 16 can be formed of any type of metal, such as gold, gold combined with electroplated solder (e.g., gold covered with tin (Sn)-based electroplated solder), and/or the like.

In an embodiment, the thermal management structure 50 is formed after formation of the heterostructure for an optoelectronic device 10, prior to the formation of the p-type contact 30. To this extent, the heterostructure for the optoelectronic device 10 can be obtained using any solution (e.g., fabricated as described herein or using any solution), and the n-type contact 14 can be formed on the n-type layer 22 using any solution, e.g., deposition. In a more particular embodiment, a thickness of the n-type contact 14 can be increased to a desired thickness using any solution. For example, a surface of the mesa structure 12 can be isolated using a mask or the like and electroplating can be applied to increase the thickness of the n-type contact 14 to a desired thickness. Subsequently, the surface of the mesa structure 12 can be exposed, e.g., by removing the mask. The dielectric layer 52 can be applied (e.g., deposited) over the entire structure, including the mesa structure 12. Next, the dielectric layer 52 can be removed from the top surface of the mesa structure 12, e.g., using photolithography, or the like. The p-type contact 30 can be applied to the top of the mesa structure 12 using any solution, e.g., deposition.

An electroplating process is used to monolithically form the electroplated metal 54 to extend the p-type contact regions 30A, 30B and form bridge structures 56A, 56B over the one or more n-type contact regions 14A, 14B. During this process, initially disjoint and/or irregularly shaped p-type contact regions 30A, 30B can be merged together into a conductive layer electroplated on top of the p-type contact regions 30A, 30B. In an embodiment, a cross-section of a top surface of the electroplated metal 54 is monolithic and maximized to occupy substantially all of a region allocated for the corresponding contact (e.g., p-type contact 30). In this case, the electroplating process continues until all initially disjoint contact regions are connected, all irregularly shaped regions are merged, and/or the like. For example, as shown in FIG. 4, a top surface of the electroplated metal 54 can cover the entire rectangular region denoted by the electroplated metal 54. In this case, the electroplated metal 54 substantially increases a cross section of the corresponding contact 30, which has an initial cross section defined by the top surface of the mesa structure 12.

In an embodiment, the electroplating process includes changing the material for the electroplated metal 54 to form multiple types of metallic layers within the electroplated metal 54 and/or a graded composition for the electroplated metal 54. For example, the electroplated metal 54 adjacent to the p-type contact 30 can contain gold and a large (e.g., at least one percent) content of aluminum, which is reduced (e.g., continually and/or in discrete steps) during the electroplating process until the electroplated metal 54 includes only gold on a side opposite the p-type contact 30. Similarly, the p-type contact 30 can be formed of a graded composition and/or multiple metallic layers. For example, in an embodiment, the p-type contact 30 is formed of: a set of ohmic layers adjacent to the p-type cladding layer 28; a set of reflective layers; and a set of transition layers between the ohmic layer(s) and reflective layer(s), where the transition layer(s) are protective and prohibit the reflective layer(s) from interacting with the ohmic layer(s).

While aspects of the invention have been shown and described in conjunction with a single semiconductor device 10, it is understood that embodiments can be directed to thermal management for a complex device formed of multiple semiconductor devices 10. For example, the complex device can include an array of elements, each of which can comprise a semiconductor device, such as a light emitting diode, a semiconductor diode, and/or the like. For example, FIG. 5 shows two distinct areas of a mesa structure 12 connected by a bridge 56A. In an embodiment, each area of the mesa structure 12 can correspond to a distinct semiconductor device in an array of devices forming a complex device. In this case, the bridge structure 56A joins the smaller contacts 30A, 30B of the different semiconductor devices into a single, larger area defined by the electroplated metal 54.

It is understood that the thermal management structure 50 can include additional components, e.g., as part of a flip chip mounting configuration. For example, FIG. 6 shows a cross sectional view of a schematic structure of an illustrative thermal management structure 50 for a device 10 according to an embodiment. In this case, the electroplated metal 54 is attached to a larger heat dissipating element 58 using solder 56 (e.g., Sn-based soldering bumps). The heat dissipating element 58 can comprise any type of heat sink having any type of configuration for facilitating the removal of heat from the device 10. In an embodiment, the larger heat dissipating element 58 comprises a submount, such as a silicon carbide block, or the like. While solder 56 is described as being used to attach the heat dissipating element 58 to the electroplated metal 54, it is understood that any solution for attaching the elements 54, 58 can be utilized. Additionally, while the heat dissipating element 58 is described herein in conjunction with thermal management of the device 10, it is understood that the heat dissipating element 58 can provide additional functionality. For example, in an embodiment the heat dissipating element 58 also is configured to protect the device 10 against transient electrical events, such as electrostatic discharge (ESD), or the like.

In an embodiment, the invention provides a method of designing and/or fabricating a device described herein and/or a circuit that includes one or more of the devices designed and fabricated as described herein. To this extent, FIG. 7 shows an illustrative flow diagram for fabricating a circuit 1026 according to an embodiment. Initially, a user can utilize a device design system 1010 to generate a device design 1012 for a semiconductor device as described herein. The device design 1012 can comprise program code, which can be used by a device fabrication system 1014 to generate a set of physical devices 1016 according to the features defined by the device design 1012. Similarly, the device design 1012 can be provided to a circuit design system 1020 (e.g., as an available component for use in circuits), which a user can utilize to generate a circuit design 1022 (e.g., by connecting one or more inputs and outputs to various devices included in a circuit). The circuit design 1022 can comprise program code that includes a device designed as described herein. In any event, the circuit design 1022 and/or one or more physical devices 1016 can be provided to a circuit fabrication system 1024, which can generate a physical circuit 1026 according to the circuit design 1022. The physical circuit 1026 can include one or more devices 1016 designed as described herein.

In another embodiment, the invention provides a device design system 1010 for designing and/or a device fabrication system 1014 for fabricating a semiconductor device 1016 as described herein. In this case, the system 1010, 1014 can comprise a general purpose computing device, which is programmed to implement a method of designing and/or fabricating the semiconductor device 1016 as described herein. Similarly, an embodiment of the invention provides a circuit design system 1020 for designing and/or a circuit fabrication system 1024 for fabricating a circuit 1026 that includes at least one device 1016 designed and/or fabricated as described herein. In this case, the system 1020, 1024 can comprise a general purpose computing device, which is programmed to implement a method of designing and/or fabricating the circuit 1026 including at least one semiconductor device 1016 as described herein.

In still another embodiment, the invention provides a computer program fixed in at least one computer-readable medium, which when executed, enables a computer system to implement a method of designing and/or fabricating a semiconductor device as described herein. For example, the computer program can enable the device design system 1010 to generate the device design 1012 as described herein. To this extent, the computer-readable medium includes program code, which implements some or all of a process described herein when executed by the computer system. It is understood that the term "computer-readable medium" comprises one or more of any type of tangible medium of expression, now known or later developed, from which a stored copy of the program code can be perceived, reproduced, or otherwise communicated by a computing device.

In another embodiment, the invention provides a method of providing a copy of program code, which implements some or all of a process described herein when executed by a computer system. In this case, a computer system can process a copy of the program code to generate and transmit, for reception at a second, distinct location, a set of data signals that has one or more of its characteristics set and/or changed in such a manner as to encode a copy of the program code in the set of data signals. Similarly, an embodiment of the invention provides a method of acquiring a copy of program code that implements some or all of a process described herein, which includes a computer system receiving the set of data signals described herein, and translating the set of data signals into a copy of the computer program fixed in at least one computer-readable medium. In either case, the set of data signals can be transmitted/received using any type of communications link.

In still another embodiment, the invention provides a method of generating a device design system 1010 for designing and/or a device fabrication system 1014 for fabricating a semiconductor device as described herein. In this case, a computer system can be obtained (e.g., created, maintained, made available, etc.) and one or more components for performing a process described herein can be obtained (e.g., created, purchased, used, modified, etc.) and deployed to the computer system. To this extent, the deployment can comprise one or more of: (1) installing program code on a computing device; (2) adding one or more computing and/or I/O devices to the computer system; (3) incorporating and/or modifying the computer system to enable it to perform a process described herein; and/or the like.

The foregoing description of various aspects of the invention has been presented for purposes of illustration and description. It is not intended to be exhaustive or to limit the invention to the precise form disclosed, and obviously, many modifications and variations are possible. Such modifications and variations that may be apparent to an individual in the art are included within the scope of the invention as defined by the accompanying claims.

What is claimed is:

1. A device including:
   a first contact of a first type located on a first side of the device, the first contact including a first contact region and a second contact region both of the first type, wherein each of the first contact region and the second contact region is formed of only one particular type of semiconductor material, and both the first contact region and the second contact region are formed of a same type of semiconductor material, and wherein the first type is one of: a p-type semiconductor or an n-type semiconductor;
   a second contact of a second type, distinct from the first type, wherein the second contact includes a third contact region located on the first side of the device between the first contact region and the second contact region, and wherein the second type is the other of: the p-type semiconductor or the n-type semiconductor; and
   a thermal management structure, the thermal management structure including electroplated metal contacting a top surface of the first contact region and a top surface of the second contact region and forming a bridge structure extending over the third contact region without contacting the third contact region of the second contact, wherein the bridge structure connects the first contact region with the second contact region, wherein the bridge structure contacts a side surface of each of the first contact region and the second contact region, and arches outward from each of the side surfaces of the first contact region and the second contact region.

2. The device of claim 1, the thermal management structure further including a layer of insulating material located between the third contact region and the electroplated metal, wherein the bridge structure extends over the layer of insulating material and the third contact region.

3. The device of claim 1, wherein the electroplated metal includes gold.

4. The device of claim 3, wherein the electroplated metal further includes electroplated solder.

5. The device of claim 1, the thermal management structure further including:
   a submount; and
   means for attaching the electroplated metal to the submount.

6. The device of claim 5, wherein the submount is formed of silicon carbide.

7. The device of claim 5 wherein the means for attaching includes solder.

8. The device of claim 1, further comprising a light emitting active region, wherein the device is configured to be operated as one of: a light emitting diode or a laser.

9. The device of claim 1, wherein the device is configured to be operated as one of: a diode or a transistor.

10. A device comprising:
    a first contact region of a first type located on a first side of the device;
    a second contact region of the first type located on the first side of the device, wherein each of the first contact region and the second contact region is formed of only one particular type of semiconductor material, and both the first contact region and the second contact region are formed of a same type of semiconductor material, and wherein the first type is one of: a p-type semiconductor or an n-type semiconductor;
    a third contact region of a second type, distinct from the first type, located on the first side of the device between the first contact region and the second contact region, wherein the second type is the other of: the p-type semiconductor or the n-type semiconductor; and
    a thermal management structure, the thermal management structure including:
      a layer of insulating material located on the third contact region; and
      electroplated metal contacting a top surface of the first contact region and the second contact region and forming a bridge structure extending over the layer of insulating material and the third contact region, wherein the bridge structure connects the first contact region with the second contact region without contacting the third contact region, wherein the bridge structure contacts a side surface of each of the first contact region and the second contact region, and arches outward from each of the side surfaces of the first contact region and the second contact region.

11. The device of claim 10, wherein the device is formed of an array of elements, wherein a contact for a first element in the array of elements comprises the first contact region and a contact for a second element in the array of elements, distinct from the first element, comprises the second contact region.

12. The device of claim 10, the thermal management structure further including:
    a heat dissipating element; and
    means for attaching the electroplated metal to the heat dissipating element.

13. The device of claim 12, wherein the heat dissipating element comprises a submount formed of silicon carbide.

14. The device of claim 12, wherein the means for attaching includes solder.

15. The device of claim 10, wherein the electroplated metal includes gold.

16. A device, comprising:
    a first contact of a first type located on a first side of the device, the first contact including a first contact region and a second contact region;
    a second contact of a second type, distinct from the first type, wherein the second contact includes a third contact region located on the first side of the device between the first contact region and the second contact region; and a thermal management structure including an electroplated metal contacting a top surface of the first contact region and a top surface of the second contact region and forming a bridge structure extending over the third contact region without contacting the third contact region, wherein the bridge structure contacts a side surface of each of the first contact region and the second contact region, and arches outward from each of the side surfaces of the first contact region and the second contact region.

17. The device of claim 16, wherein the first contact region and the second contact region each has a thickness that is larger than a thickness of the third contact region.

18. The device of claim 16, wherein the first contact region and the second contact region are located on a mesa structure extending above the third contact region on the first side of the device.

19. The device of claim 16, wherein the thermal management structure further includes a layer of insulating material located between the third contact region and the electroplated metal, wherein the bridge structure extends over the layer of insulating material and the third contact region.

20. The device of claim 19, wherein the bridge structure extends over the layer of insulating material without contacting the layer of insulating material.

* * * * *